United States Patent
Vermont et al.

(10) Patent No.: US 9,478,449 B2
(45) Date of Patent: Oct. 25, 2016

(54) FLOATING SUBSTRATE MONITORING AND CONTROL DEVICE, AND METHOD FOR THE SAME

(75) Inventors: Pascal Gustaaf Vermont, Almere (NL); Wilhelmus Gerardus Van Velzen, Almere (NL); Vladimir Ivanovich Kuznetsov, Almere (NL); Ernst Hendrik August Granneman, Almere (NL); Gonzalo Felipe Ramirez Troxler, Almere (NL)

(73) Assignee: ASM INTERNATIONAL N.V., Almere (NL)

( * ) Notice: Subject to any disclaimer, the term of this patent is extended or adjusted under 35 U.S.C. 154(b) by 0 days.

(21) Appl. No.: 14/232,901

(22) PCT Filed: Jul. 13, 2012

(86) PCT No.: PCT/NL2012/050506
§ 371 (c)(1),
(2), (4) Date: Mar. 3, 2014

(87) PCT Pub. No.: WO2013/009184
PCT Pub. Date: Jan. 17, 2013

(65) Prior Publication Data
US 2014/0199788 A1 Jul. 17, 2014

Related U.S. Application Data

(60) Provisional application No. 61/562,506, filed on Nov. 22, 2011.

(30) Foreign Application Priority Data

Jul. 14, 2011 (NL) .................. 2007114

(51) Int. Cl.
*H01L 21/67* (2006.01)
*H01L 21/66* (2006.01)
(Continued)

(52) U.S. Cl.
CPC ....... *H01L 21/67276* (2013.01); *C23C 16/403* (2013.01); *C23C 16/45551* (2013.01);
(Continued)

(58) Field of Classification Search
CPC ............ H01L 21/67276; H01L 22/26; H01L 21/6776; H01L 21/67259; H01L 21/67784; C23C 16/54; C23C 16/45551; C23C 16/52; C23C 16/403
See application file for complete search history.

(56) References Cited

U.S. PATENT DOCUMENTS 4,165,132 A 8/1979 Hassan et al.
6,329,304 B1 * 12/2001 Kuznetsov ........ H01L 21/67248
118/718
(Continued)

FOREIGN PATENT DOCUMENTS

CN 1646400 7/2005
CN 1996567 7/2007
(Continued)

*Primary Examiner* — Jeffrie R Lund
(74) *Attorney, Agent, or Firm* — Preti Flaherty Beliveau & Pachios LLP

(57) ABSTRACT

Disclosed is a process tunnel (102) through which substrates (140) may be transported in a floating condition between two gas bearings (124, 134). To monitor the transport of the substrates through the process tunnel, the upper and lower walls (120, 130) of the tunnel are fitted with at least one substrate detection sensor (S1, . . . , S6) at a respective substrate detection sensor location, said substrate detection sensor being configured to generate a reference signal reflecting a presence of a substrate between said first and second walls near and/or at said substrate detection sensor location. Also provided is a monitoring and control unit (160) that is operably connected to the at least one substrate detection sensor (S1, . . . , S6), and that is configured to record said reference signal as a function of time and to process said reference signal.

24 Claims, 9 Drawing Sheets

(51) Int. Cl.
   *H01L 21/677*  (2006.01)
   *C23C 16/54*   (2006.01)
   *C23C 16/52*   (2006.01)
   *C23C 16/455*  (2006.01)
   *C23C 16/40*   (2006.01)

(52) U.S. Cl.
   CPC .............. C23C16/52 (2013.01); C23C 16/54 (2013.01); H01L 21/6776 (2013.01); H01L 21/67259 (2013.01); H01L 21/67784 (2013.01); H01L 22/26 (2013.01)

(56) References Cited

U.S. PATENT DOCUMENTS

| | | | |
|---|---|---|---|
| 8,207,063 B2* | 6/2012 | Cowdery-Corvan | C23C 16/407 438/149 |
| 9,238,867 B2* | 1/2016 | Granneman | C23C 16/54 |
| 9,243,330 B2* | 1/2016 | Granneman | C23C 16/45551 |
| 9,273,392 B2* | 3/2016 | Vermeer | C23C 16/45551 |
| 9,274,437 B2* | 3/2016 | Ebihara | B82Y 10/00 |
| 2004/0195737 A1* | 10/2004 | Storm | H01L 21/67109 266/80 |
| 2007/0160454 A1 | 7/2007 | Iida | |
| 2009/0291209 A1* | 11/2009 | Granneman | C23C 16/45551 427/255.5 |
| 2011/0124199 A1* | 5/2011 | Granneman | C23C 16/45551 438/758 |
| 2011/0174800 A1 | 7/2011 | Chino et al. | |
| 2011/0268879 A1* | 11/2011 | Granneman | C23C 16/54 427/255.5 |
| 2012/0196050 A1* | 8/2012 | Vermeer | C23C 16/45551 427/535 |
| 2013/0199448 A1* | 8/2013 | Granneman | B65G 51/03 118/729 |
| 2014/0030445 A1* | 1/2014 | Vermeer | C23C 16/45551 427/569 |
| 2014/0037847 A1* | 2/2014 | Vermeer | C23C 16/45551 427/255.28 |
| 2014/0199788 A1* | 7/2014 | Vermont | C23C 16/403 438/5 |
| 2016/0102399 A1* | 4/2016 | Granneman | C23C 16/45551 118/729 |
| 2016/0122874 A1* | 5/2016 | Vermeer | C23C 16/45574 118/715 |
| 2016/0202617 A1* | 7/2016 | Ebihara | G03F 7/70341 355/30 |

FOREIGN PATENT DOCUMENTS

| | | |
|---|---|---|
| CN | 101990707 | 3/2011 |
| EP | 2 159 304 A1 | 3/2010 |
| JP | 2009071323 A | 4/2009 |
| WO | 84/03195 A1 | 8/1984 |
| WO | 2009/142488 A1 | 11/2009 |
| WO | 2012/005577 A1 | 1/2012 |

* cited by examiner

FLOATING SUBSTRATE MONITORING AND CONTROL DEVICE, AND METHOD FOR THE SAME

CROSS-REFERENCES TO RELATED APPLICATIONS

This application is a National Stage of International Application No. PCT/NL2012/050506, filed Jul. 13, 2012, which claims the benefit of Netherlands Patent Application No. 2007114, filed Jul. 14, 2011 and U.S. provisional application 61/562,506, filed Nov. 22, 2011, the disclosures of which are incorporated herein by reference.

FIELD OF THE INVENTION

The present invention relates to a semiconductor processing apparatus including a process tunnel through which substrates, e.g. silicon wafers, may be transported in succession while being floatingly accommodated between two gas bearings, and more in particular to a device and a method for monitoring the behavior of these substrates to timely detect any abnormalities in the operation of the apparatus.

BACKGROUND

International patent application WO 2009/142488 discloses a semiconductor processing apparatus capable of processing semiconductor substrates in continuous succession. The apparatus features a process tunnel defining a linear track along which substrates may be transported while being processed. During transport and processing, the substrates may be floatingly accommodated between two gas bearings, which gas bearing may both enable contactless substrate propulsion and provide for a reactive or non-reactive processing environment. Compared to the batch wise processing encountered in conventional vertical and horizontal (thermal) furnaces, the apparatus of WO'488 offers significantly improved throughput rates on the order of thousands of substrates per hour.

The process tunnel of the apparatus may be relatively long, e.g. on the order of several meters, and define a practically closed process tunnel space that is not accessible for maintenance or repair without shutting down the (production of the) apparatus as a whole. With possibly thousands of fragile semiconductor substrates whizzing through the tunnel space per hour, a tool to monitor the behavior of both individual substrates and sets of substrates, to detect abnormalities in the processing thereof, and to enable swift corrective action is practically indispensable.

It is an object of the present invention to provide for such a monitoring and control tool.

SUMMARY OF THE INVENTION

A first aspect of the present invention is directed to a semiconductor processing apparatus. The apparatus includes a process tunnel, extending in a longitudinal direction and bounded by at least a first and a second wall, said walls being mutually parallel and spaced apart so as to allow a substantially flat substrate, oriented parallel to the walls, to be accommodated there between. The apparatus further includes a plurality of gas injection channels, provided in both the first and the second walls, wherein the gas injection channels in the first wall are configured to provide for a first gas bearing, while the gas injection channels in the second wall are configured to provide for a second gas bearing, said gas bearings being configured to floatingly support and accommodate said substrate there between. The first and/or second walls of the process tunnel are fitted with at least one substrate detection sensor at a substrate detection sensor location, said substrate detection sensor being configured to generate a reference signal reflecting a presence of a substrate between said first and second walls near and/or at said substrate detection sensor location. The apparatus also includes a monitoring and control unit that is operably connected to the at least one substrate detection sensor, and that is configured to record said reference signal as a function of time and to process said signal.

A second aspect of the present invention is directed to a method. The method includes providing a process tunnel, extending in a longitudinal direction and bounded by at least a first and a second wall, said walls being mutually parallel and spaced apart so as to allow a substantially flat substrate, oriented parallel to the walls, to be accommodated there between. The method further includes providing a first gas bearing by providing preferably substantially laterally flowing gas alongside the first wall, and providing a second gas bearing by providing preferably substantially laterally flowing gas alongside the second wall. The method also includes successively introducing a plurality of substrates in between the first wall and the second wall, such that each substrate is floatingly accommodated between the first and second gas bearings, and moving said substrates in succession along the longitudinal direction of the process tunnel. In addition, the method comprises repeatedly registering whether a substrate is present between the first and second tunnel walls near and/or at least one substrate detection location in said process tunnel, thereby recording at least one reference signal reflecting a presence of a substrate between said first and second walls near and/or at said substrate detection location as a function of time, and processing said at least one recorded reference signal.

The reference signals generated by the substrate detection sensors form a rich source of information on the behavior of the substrates that move through the tunnel. This behavior may be analyzed by processing the reference signal(s), which processing may entail displaying information encoded in the reference signals for inspection by an operator, and, additionally or alternatively, automated analysis. During automated analysis, the reference signals may be analyzed to (quantatatively) determine one or more substrate properties reflected by the reference signals and related to the lateral position and/or longitudinal position of a single substrate or multiple substrates. Values of the determined properties may be compared against a property-specific tolerance range to see if corrective action is required, in particular by adapting operating parameters of the apparatus/process tunnel so as to bring the value of the property back inside that tolerance range.

In this text, a 'longitudinal position' refers to a spatial coordinate measured along the longitudinal or transport direction of the process tunnel, while a 'lateral position' refers to a spatial coordinate measured along a direction perpendicular to said longitudinal direction and parallel to the tunnel walls. The term 'position of a substrate' is to be construed as the space occupied by the substrate, such that a 'longitudinal and/or lateral position of a substrate' refers to the space occupied by the substrate in the longitudinal and/or lateral dimensions just defined. Examples of longitudinal and/or lateral position-related properties of a single substrate or an aggregate of multiple substrates are discussed in detail in the detailed description below. The term 'recording' in this text may be construed to refer to the act of registering or preserving information in a form that enables future reference thereto.

These and other features and advantages of the invention will be more fully understood from the following detailed description of certain embodiments of the invention, taken together with the accompanying drawings, which are meant to illustrate and not to limit the invention.

BRIEF DESCRIPTION OF THE DRAWINGS

FIG. 7 is a diagrammatic cross-sectional plan view of a section of a process tunnel similar to that shown in FIGS. 1-3, which section includes two longitudinally spaced apart optical-type substrate detection sensors, and a yawing substrate that is passing by;

DETAILED DESCRIPTION

Figure 1:
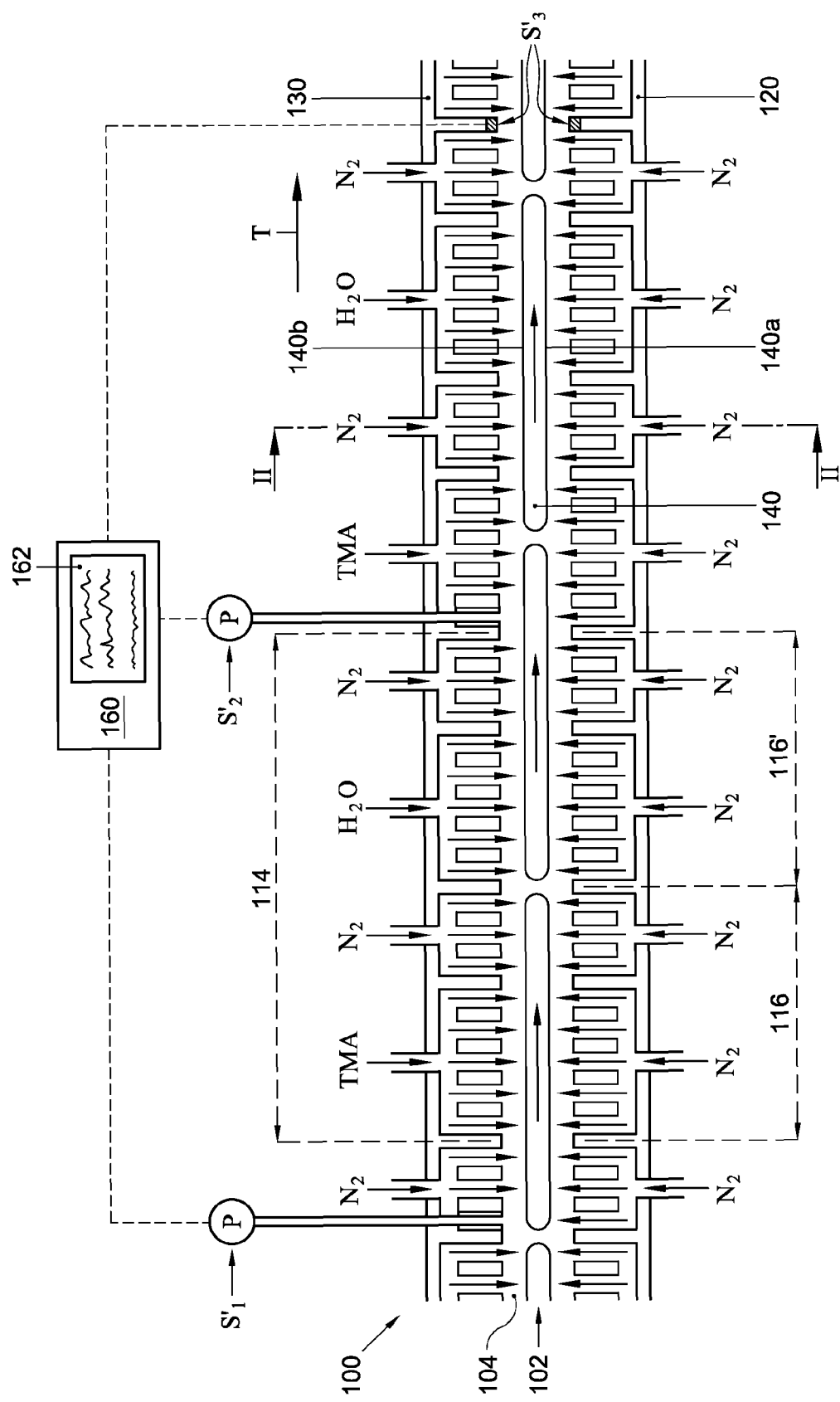
FIG. 1 is a diagrammatic longitudinal cross-sectional view of a portion of an exemplary embodiment of an apparatus according to the present invention.

An exemplary embodiment of an apparatus according to the present invention, which implements the method according to the present invention, will be described below with reference to FIGS. 1-3. The exemplary embodiment is set up as a spatial atomic layer deposition (ALD) apparatus. It is understood, however, that the scope of application of the apparatus and the method according to the present invention is not limited to the field of atomic layer deposition. The apparatus and method may be applied for the purpose of performing different substrate processing treatments, such as annealing.

The disclosed apparatus 100 may include a process tunnel 102 through which a substrate 140, e.g. a silicon wafer, preferably as part of a train of substrates, may be conveyed in a linear manner. That is, the substrate 140 may be inserted into the process tunnel 102 at an entrance thereof to be uni-directionally conveyed to an exit. Alternatively, the process tunnel 102 may have a dead end and the substrate 140 may undergo a bi-directional motion from an entrance of the process tunnel, towards the dead end, and back to the entrance. Such an alternative bi-directional system may be preferred if an apparatus with a relatively small footprint is desired. Although the process tunnel 102 itself may be rectilinear, such need not necessarily be the case.

The process tunnel 102 may include four walls: an upper wall 130, a lower wall 120, and two lateral or side walls 108. The upper wall 130 and the lower wall 120 may be oriented horizontally or at an angle relative to the horizontal, mutually parallel and be spaced apart slightly, e.g. 0.5-1 mm, such that a substantially flat or planar substrate 140, having a thickness of for example 0.1-1 mm and oriented parallel to the upper and lower walls 130, 120, may be accommodated there between without touching them. The lateral walls 108, which may be oriented substantially vertically and mutually parallel, may interconnect the upper wall 130 and the lower wall 120 at their lateral sides. The lateral walls 108 may be spaced apart by a distance somewhat larger than a width of a substrate 140 to be processed, e.g. its width plus 0.5-3 mm. Accordingly, the walls 108, 120, 130 of the process tunnel 102 may define and bound an elongate process tunnel space 104 having a relatively small volume per unit of tunnel length, and capable of snugly accommodating one or more substrates 140 that are successively arranged in the longitudinal direction of the tunnel.

Both the upper tunnel wall 130 and the lower tunnel wall 120 may be provided with a plurality of gas injection channels 132, 122. The gas injection channels 132, 122 in either wall 130, 120 may be arranged as desired as long as at least a number of them is dispersed across the length of the tunnel 102. Gas injection channels 132, 122 may, for example, be disposed on the corners of an imaginary rectangular grid, e.g. a 25 min×25 mm grid, such that gas injection channels are regularly distributed over an entire inner surface of a respective wall, both in the longitudinal and lateral direction thereof.

The gas injection channels 122, 132 may be connected to gas sources, preferably such that gas injection channels in the same tunnel wall 120, 130 and at the same longitudinal position thereof are connected to a gas source of a same gas or gas mixture. For ALD-purposes, the gas injection channels 122, 132 in at least one of the lower wall 120 and the upper wall 130 may, viewed in the transport direction T, be successively connected to a first precursor gas source, a purge gas source, a second precursor gas source and a purge gas source, so as to create a functional ALD-segment 114 that—in use—will comprise successive tunnel-wide gas zones including a first precursor gas, a purge gas, a second precursor gas and a purge gas, respectively. It is understood that one such an ALD-segment 114 corresponds to a single ALD-cycle. Accordingly, multiple ALD-segments 114 may be disposed in succession in the transport direction T to enable the deposition of a film of a desired thickness. Different ALD-segments 114 within a process tunnel 102 may, but need not, comprise the same combination of precursors. Differently composed ALD-segments 114 may for example be employed to enable the deposition of mixed films.

Whether opposing gas injection channels 122, 132, which share a same longitudinal position of the process tunnel but are situated in opposite tunnel walls 120, 130, are connected to gas sources of the same gas composition may depend on the desired configuration of the apparatus 100. In case double-sided deposition is desired, i.e. ALD treatment of both the upper surface 140b and lower surface 140a of a substrate 140 travelling through the process tunnel 102, opposing gas injection channels 122, 132 may be connected to the same gas source. Alternatively, in case only single-sided deposition is desired, i.e. ALD treatment of merely one of the upper surface 140b and lower surface 140a of a substrate 140 to be processed, gas injection channels 122, 132 in the tunnel wall 120, 130 facing the substrate surface to be treated may be alternatingly connected to a reactive and an inert gas source, while gas injection channels in the other tunnel wall may all be connected to an inert gas source.

Figure 2:
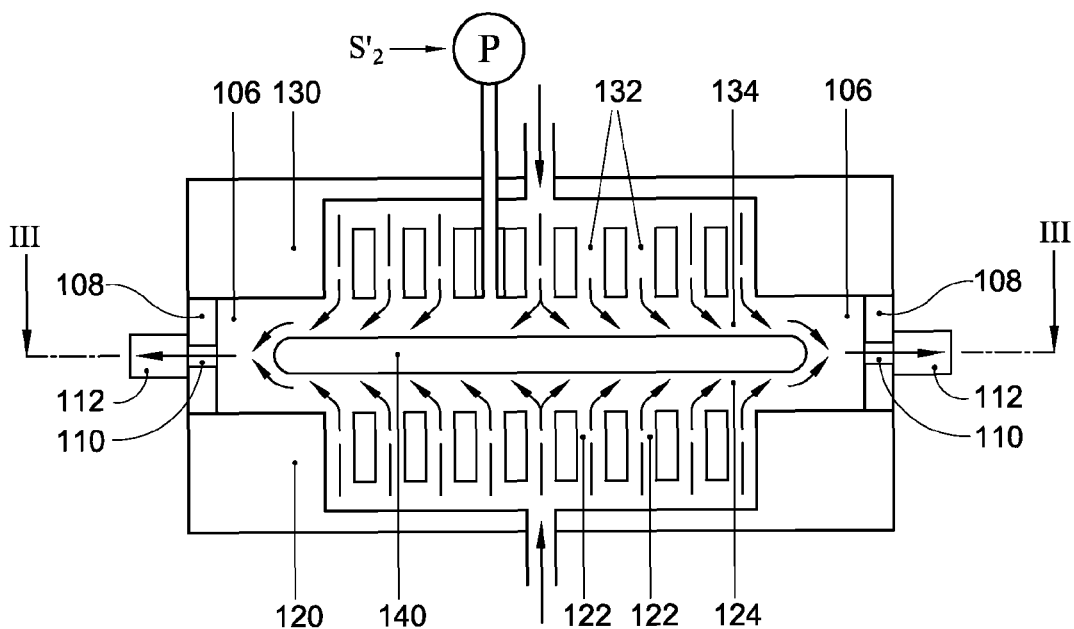
FIG. 2 is a diagrammatic lateral cross-sectional view of the apparatus shown in FIG. 1.
Figure 3:
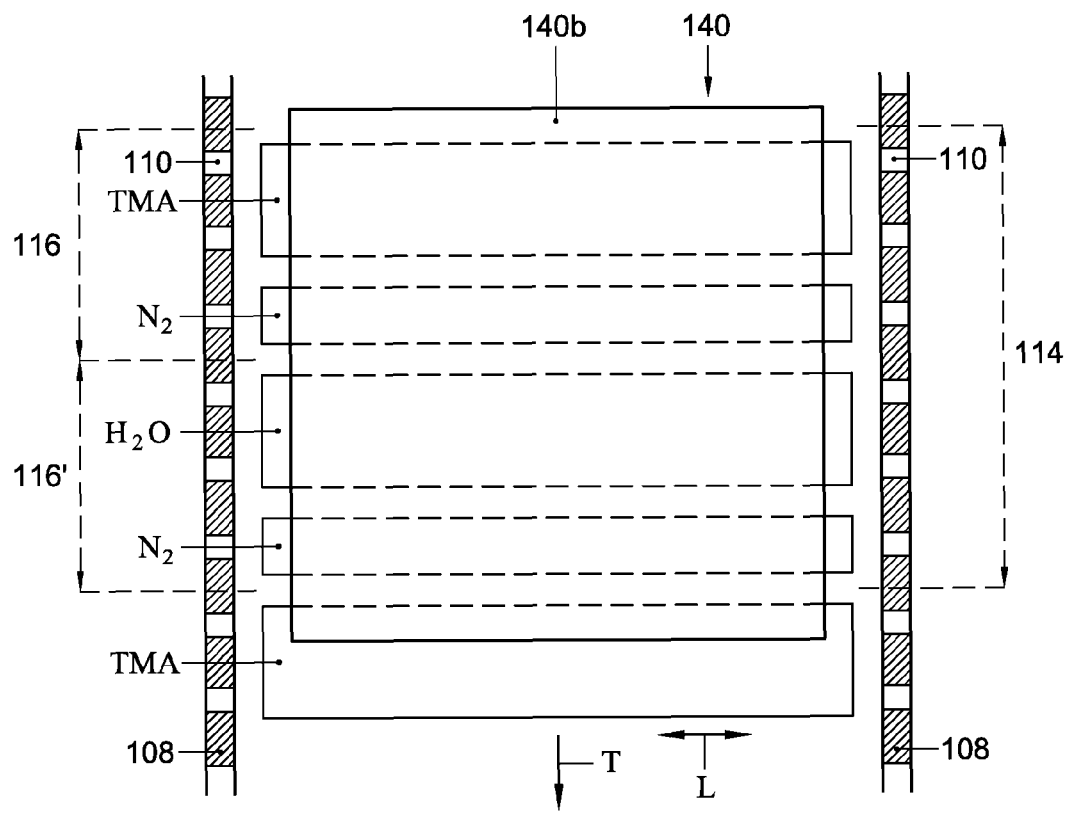
FIG. 3 is a diagrammatic cross-sectional plan view of a portion of the process tunnel shown in FIGS. 1-2.

In the exemplary embodiment of FIGS. 1-3, the gas injection channels 132 in the upper wall 130 are successively connected to a trimethylaluminum ($Al(CH_3)_3$, TMA) source, a nitrogen ($N_2$) source, a water ($H_2O$) source, and a nitrogen source, so as to form a series of identical ALD-segments 114 suitable for performing aluminum oxide ($Al_2O_3$) atomic layer deposition cycles. The gas injection channels 122 in the lower tunnel wall 120, in contrast, are all connected to a nitrogen source. Accordingly, the exemplary apparatus 100 is set up to maintain an upper depositing gas bearing 134 and a lower non-depositing gas bearing 124, together configured to perform single-sided deposition on a top surface 140b of a passing, floatingly supported substrate 140.

Each of the lateral walls 108 of the process tunnel 102 may, along its entire length or a portion thereof, be provided with a plurality of gas exhaust channels 110. The gas exhaust channels 110 may be spaced apart—preferably equidistantly—in the longitudinal direction of the process tunnel. The distance between two neighboring or successive gas exhaust channels 110 in a same lateral wall 108 may be related to a length of the substrates 140 to be processed (in this text, the 'length' of a rectangular substrate 140 is to be construed as the dimension of the substrate generally extending in the longitudinal direction of the process tunnel 120). A lateral wall portion the length of a substrate 140 may preferably comprise between approximately 5 and 20, and more preferably between 8 and 15, exhaust channels 110. The center-to-center distance between two successive gas exhaust channels 110 may be in the range of approximately 10-30 mm.

The gas exhaust channels 110 may be connected to and discharge into gas exhaust conduits 112 provided on the outside of the process tunnel 102. In case the apparatus 100 is set up to perform ALD, the exhaust gases may contain quantities of unreacted precursors. Accordingly, it may be undesirable to connect gas exhaust channels 110 associated with mutually different reactive gas zones to the same gas exhaust conduit 112 (which may unintentionally lead to chemical vapor deposition). Different gas exhaust conduits 112 may thus be provided for different precursors.

The first and second walls 120, 130 of the apparatus 100 may each include one or more, i.e. a plurality of, substrate detection sensors S'. A substrate detection sensor S' may be of any suitable type and be disposed at a suitably chosen substrate detection sensor location, which location may typically be expressed in terms of a coordinate pair including a longitudinal and a lateral position.

In one embodiment, the at least one substrate detection sensor may include an optical sensor $S'_3$. The optical sensor $S'_3$ may for example include a light source disposed in one of the first and second walls 120, 130 of the process tunnel 102, and a photo detector disposed in the other of the first and second walls 120, 130 of the process tunnel, opposite to the light source. An advantage of an optical sensor is that it may provide for a timewise and positionally accurate, and in particular when it has a small photo detector area: practically binary, reference signal, which may typically take the form of a (square) pulse train, with a peak or pulse at every instant that a line of sight between the light source and the photo detector is interrupted by a substrate 140 passing therebetween. This advantage corresponds to a drawback, because an optical sensor will normally not provide information about the presence of a substrate near a substrate detection sensor location; instead, it only provides information about a substrate at the substrate detection sensor location.

To overcome this drawback, the at least one substrate detection sensor in another, preferred embodiment of the invention may include a pressure sensor $S'_1$, $S'_2$ configured to register the gas pressure of the first and/or second gas bearing 124, 134. The pressure sensor $S'_1$, $S'_2$ may for example include a gas tube, having a first end located at the surface of the first or second tunnel wall 120, 130, and having a second end connected to a pressure transducer. Changes in the pressure of the gas bearing 124, 134 adjacent the first end of the gas tube will be fluidly communicated (by the gas in the gas tube) to the pressure transducer at the second end, which transducer may then produce a reference signal reflecting the pressure of the respective bearing at the sensor's location.

That a pressure sensor $S'_1$, $S'_2$ is capable of detecting the presence of a substrate 140 both near and at the location at which it is provided is a consequence of the fact that a substrate moving through the narrow process tunnel interacts with the gas bearings 124, 134. More particularly, it obstructs the flow of the gas in the gas bearings 124, 134, which results in pressure variations in the gas bearings surrounding the substrate 140. From a pressure point of view, a travelling substrate 140 may be regarded as a travelling pressure distribution or pressure field. If the pressure on a substrate surface 140a, 140b were plotted in three dimensions as a function of the longitudinal and lateral position on the respective substrate surface, the pressure distribution plot would roughly resemble a three dimensional bell shape with its apex located at the position that corresponds to the substrate's geometrical center. The pressure distributions on the upper and lower surfaces 140a, 140b of the substrate 140 may generally be regarded to mirror each other in the plane of the substrate. The center of the substrate 140 thus corresponds to a region of high pressure, which falls off towards and beyond the edges of the substrate, and the distribution as a whole moves with the substrate. One consequence of this is that the pressure in the gas bearings 124, 134 at a position in front of the substrate 140 will exhibit a change, typically an increase, in gas pressure even before the substrate actually reaches that position. Similarly, the pressure in the gas bearings 124, 134 behind a substrate 140 will still show an increase relative to the situation wherein no substrate would be present at all. A pressure-time registration of a passing substrate 140 may therefore include a peak with a leading flank and a trailing flank that, rather unlike those of a square pulse that would be generated by an optical sensor, may hold information about the shape, orientation and/or speed of the substrate.

In one embodiment of the apparatus 100, the locations of at least two respective substrate detection sensors S', i.e. the locations near and/or at which—in operation—it is repeatedly registered whether a substrate is present between the first and second tunnel walls 120, 130, may be spaced apart along the longitudinal direction T of the process tunnel 102. That is, said two locations may have different longitudinal coordinates, and have a common lateral coordinate or different lateral coordinates. A longitudinal distance between multiple successive substrate detection sensors S' (as seen in the longitudinal tunnel direction T) may be regular or irregular; to facilitate human inspection of multiple recorded reference signals in raw format (e.g. a pressure amplitude as a function of time), the substrate detection sensors S' may preferably be regularly spaced apart in the longitudinal direction. The longitudinal distance between at least two successive substrate detection sensors may be larger than a longitudinal dimensions of the substrates to be processed during operation, such that a single substrate may not register its presence at both said at least two substrate detection sensors simultaneously. In addition, longitudinally spaced apart substrate detection sensors S' may preferably be disposed about midway between lateral walls of the process tunnel (as shown in FIG. 3), along a line that defines an ideal path to be followed by the geometrical centers of substrates 140, such that the sensors S' are exposed to maximal pressure variations. As will be described in more detail below, longitudinally spaced apart sensors S' may be used to determine various longitudinal position-related properties of one or more substrates 140 moving through the process tunnel. An example of such a property of a single substrate is its velocity in the longitudinal direction of the process tunnel.

In another embodiment of the invention, the locations of at least two respective substrate detection sensors S', i.e. the locations near and/or at which—in operation—it is repeatedly registered whether a substrate 140 is present between the first and second tunnel walls 120, 130, may be spaced apart along the lateral direction L of the process tunnel 102. That is, said two locations may have different lateral coordinates, and have a common longitudinal coordinate or different longitudinal coordinates. Laterally spaced apart substrate detection sensors S' may preferably be disposed adjacent lateral walls 108 of the process tunnel 102, along lines that define an ideal path to be followed by lateral edges of substrates, so as to be able to accurately detect whether a substrate laterally strays from its ideal centered position midway between the lateral walls 108 of the process tunnel 102.

The various substrate detection sensors S' of the apparatus 100 may be operably connected to a monitoring and control unit 160 (see FIG. 1). The monitoring and control unit 160 may include a clock to keep track of time; a memory for storing the reference signals received from the substrate detection sensors S' as a function of time; a processor (CPU) to, inter alia, perform an analysis on the reference signals; and a display 162, e.g. a touch display, for the input of commands by an operator and/or the output of information in visual form for inspection by the operator. The monitoring and control unit 160 may further be operably connected to one or more controllable parts of the apparatus 100, such as the gas sources connected to the gas injection channels 122, 134, adjustable valves that form restrictions in the gas exhaust conduits 112, a substrate feed assembly disposed at an entrance of the process tunnel 102, and/or a substrate discharge assembly disposed at an exit of the process tunnel 102, so as to control their operation, and thus, for example, the (local) gas pressure in the gas bearings 124, 134, and the rate of substrate insertion and discharge.

The general operation of the apparatus 100 may be described as follows. In use, both the gas injection channels 132, 122 in the upper wall 130 and the lower wall 120 inject gas into the process tunnel space 104. Each gas injection channel 122, 132 may inject the gas provided by the gas source to which it is connected. As the apparatus 100 is capable of operating at both atmospheric and non-atmospheric pressures, gas injection may take place at any suitable pressure. However, to render vacuum pumps superfluous, and to prevent any contaminating gas flows from the process tunnel environment into the tunnel space 104 (especially at the substrate entrance and exit sections), the tunnel space may preferably be kept at a pressure slightly above atmospheric pressure. Accordingly, gas injection may take place at a pressure a little above atmospheric pressure, e.g. at an overpressure on the order of several millibars. In case a lower pressure is maintained in the gas exhaust conduits 112, for example atmospheric pressure, the gas injected into the tunnel space 104 will naturally flow sideways, transverse to the longitudinal direction of the process tunnel and towards the gas exhaust channels 110 in the side walls 108 that provide access to the exhaust conduits 112.

In case a substrate 140 is present between the upper and lower walls 130, 120, the gas(es) injected into the tunnel space 104 by the gas injection channels 132 in the upper wall 130 may flow sideways between the upper wall and a top surface 140b of the substrate. These lateral gas flows across a top surface 140b of the substrate 140 effectively provide for an upper gas bearing 134. Likewise, the gas(es) injected into the tunnel space 104 by the gas injection channels 122 in the lower wall 120 will flow sideways between the lower wall and a lower surface 140a of the substrate 140. These lateral gas flows across a bottom surface 140a of the substrate 140 effectively provide for a lower gas bearing 124. The lower and upper gas bearings 124, 134 may together encompass and floatingly support the substrate 140.

As the substrate 140 moves through the process tunnel 102 its upper surface 140b is strip-wise subjected to the gases present in each of the successively arranged gas zones of the upper gas bearing 134 (cf. FIG. 3). Provided that the arrangements of the zones and the respective gases are chosen properly, traversal of one ALD-segment 114 may be equivalent to subjecting the substrate 140 to one atomic layer deposition cycle. Since the tunnel 102 may comprise as many ALD-segments 114 as desired, a film of arbitrary thickness may be grown on the substrate 140 during its crossing of the tunnel. The linear nature of the process tunnel 102 further enables a continuous stream of substrates 140 to be processed, thus delivering an atomic layer deposition apparatus 100 with an appreciable throughput capacity.

Movement of the substrate 140 may be effected in any suitable way, both by contact and non-contact methods. Non-contact methods are preferred, among other reasons because wearable mechanical parts for driving substrates may typically complicate the design of the apparatus and increase the need for maintenance. Contactless methods of propelling a substrate 140 may include:
  (i) propulsion by directed gas streams effected through gas injection channels 122, 132 that are placed at an angle relative to the transport direction T such that the injected gas streams have a tangential component in the transport direction. An example of this type of substrate propulsion is given in WO 2009/142488; see in particular FIG. 8 and the related portions of the description.
  (ii) propulsion by electric forces and/or magnetic forces.
  (iii) propulsion by gravity, which may be effected by inclining the process tunnel 120, entirely or in part, with respect to the horizontal. A gravity driven propulsion system is discussed in more detail in international patent application WO 2009/142,487.
  (iv) propulsion by a pressure differential in the longitudinal direction of the process tunnel, which may be effected by bringing about a longitudinal division of the process tunnel into a plurality of pressure segments. When the gas bearings in one pressure segment are given an average gas pressure that is different from an average gas pressure of the gas bearings in an adjacent pressure segment, the difference in average pressure between adjacent pressure segments is able to drive a substrate along the longitudinal direction of the process tunnel. A substrate propulsion system based on a pressure differential within the gas bearings of the process tunnel is disclosed in more detail in Dutch patent application NL 2005049.

Now that the construction and general operation of the apparatus 100 have been described in some detail, attention is invited to the operation of the monitoring and control unit 160. As mentioned, the monitoring and control unit 160 is operably connected to the plurality of substrate detection sensors S'. It is configured to record the reference signal of each of these sensors S' as a function of time and to process said signals.

In one embodiment of the invention, processing the signals may include displaying one or more of them, i.e. information encoded in them, on the display 162 of the monitoring and control unit 160. A reference signal may for example be displayed as a function of time, i.e. in the form of a graph showing the amplitude of the reference signal on a first axis of the graph and showing time on a second axis perpendicular to the first. A signal amplitude-versus-time graph provides raw data reflecting the movement of substrates 140 through the process tunnel 102, and enables an operator to quickly inspect and verify the proper operation of the apparatus visually. Alternatively information in the reference signals may be translated into a graphical presentation that illustrates generally linearly moving substrate-reflecting entities along a track, so as to present to the operator with an image of what he would see if the process tunnel walls 120, 130 were transparent.

The monitoring and control unit 160 may be configured to display the reference signals in real-time to enable an operator to monitor what happens in the process tunnel 102 as it happens. In such a case the graph may be a running graph in which the reference signal is shown over a certain, fixed time interval that stretches back in time from the present, and that is continuously updated. Alternatively, or in addition, the monitoring and control unit 160 may be configured to display a reference signal afterwards, based on the data record of the signal kept by the unit. In such a case, the time axis may reflect a certain selected period of time during the operation of the apparatus that is of particular interest. It is understood that the monitoring and control unit 160 may be configured to enable an operator to select which reference signals are to be shown, and over what time interval. Accordingly, the monitoring and control unit 160 may enable an operator to select multiple signals that are to be shown simultaneously, e.g. one above the other or side by side, and over the same time interval (i.e. on a common time axis). Apart from displaying the signals, the monitoring and control unit 160 may also be configured to export the data records of the reference signals, for example by storing it in a suitable digital format, for further processing and analysis on a separate computer.

Figure 4:
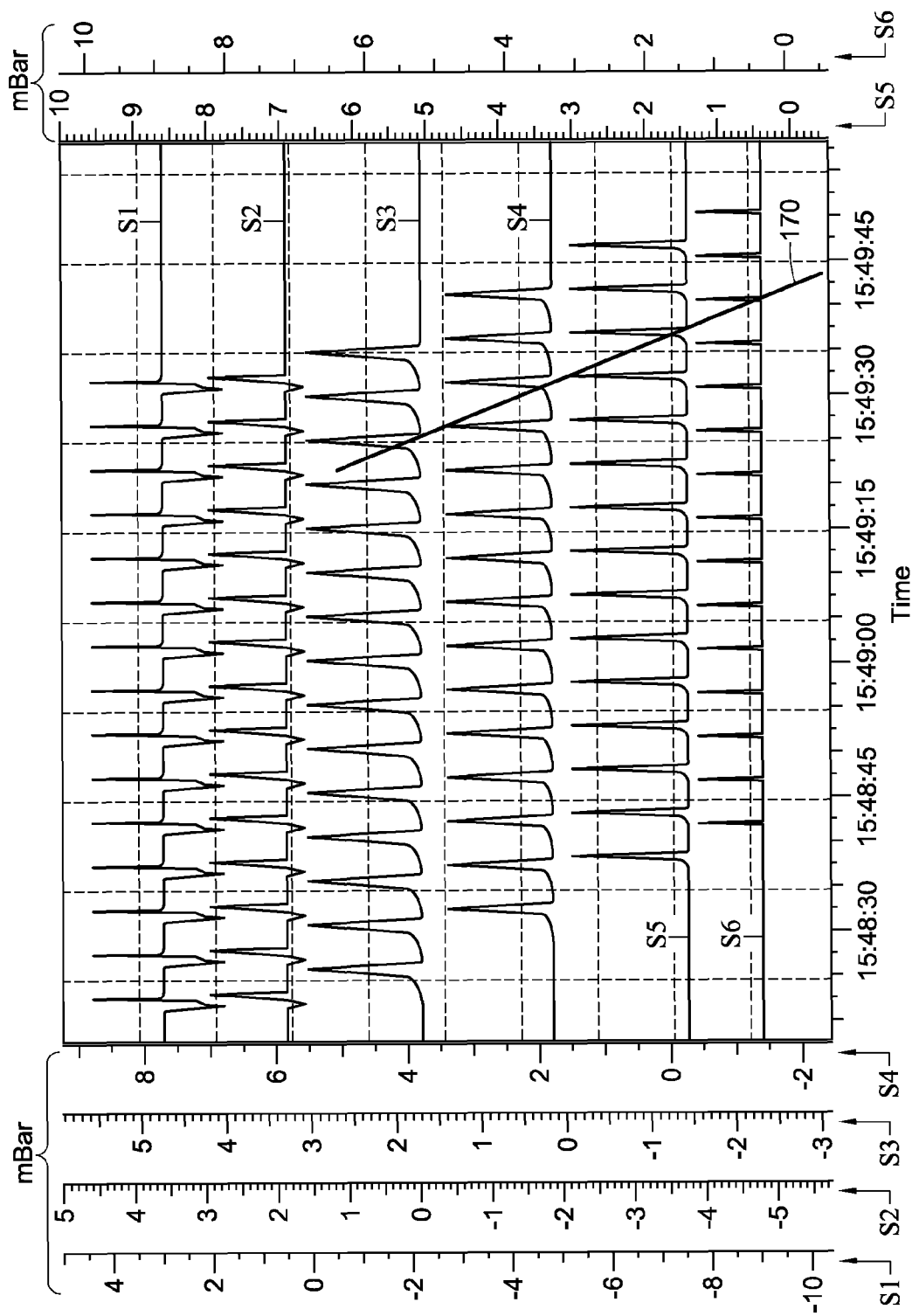
FIGS. 4-6 each schematically illustrate a graph comprising multiple reference signals from equally many longitudinally spaced apart pressure-type substrate detection sensors, which graphs were generated during different tests with an apparatus according to the present invention, similar to that described with reference to FIGS. 1-3.
Figure 5:
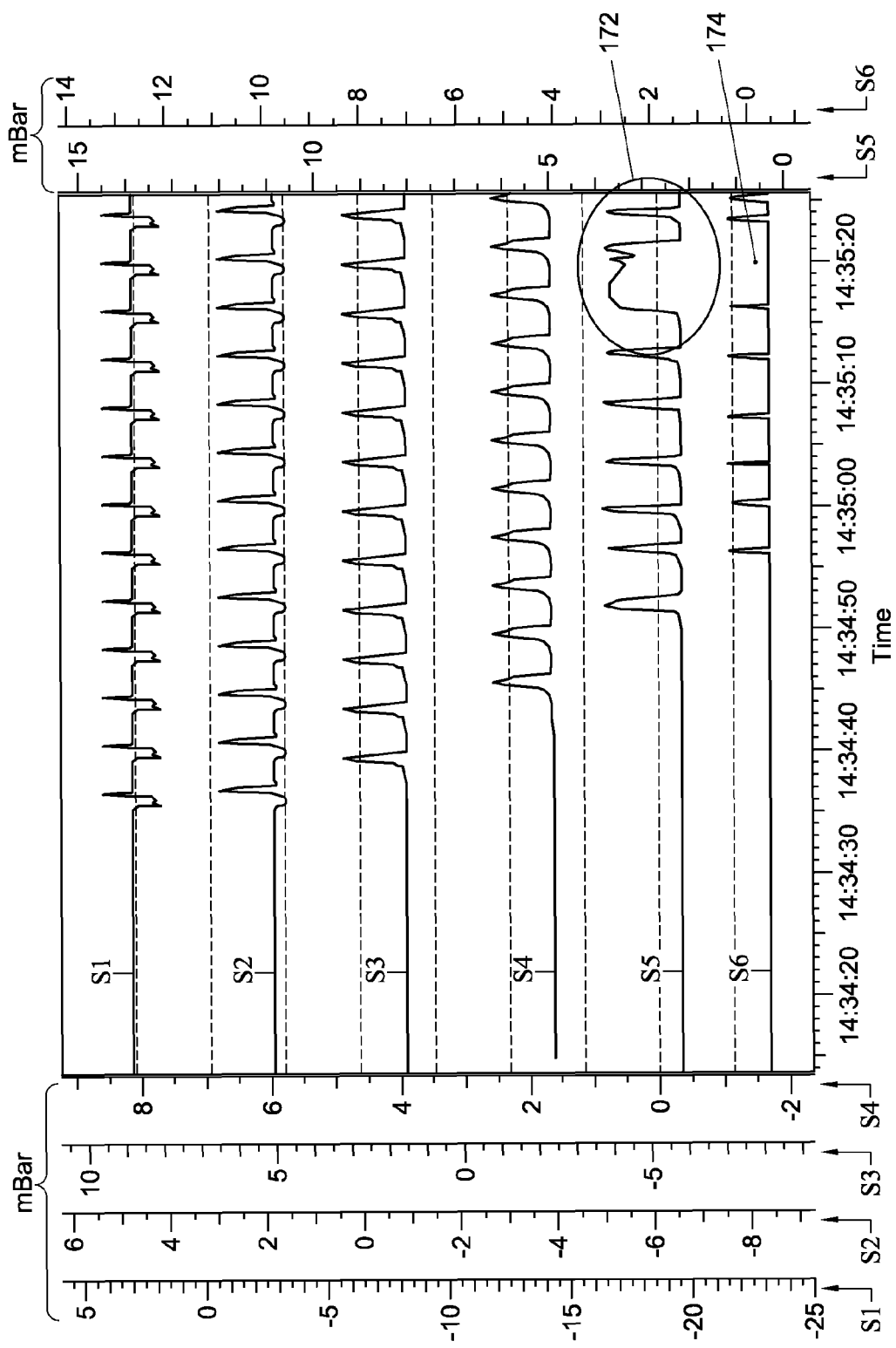
Figure 6:
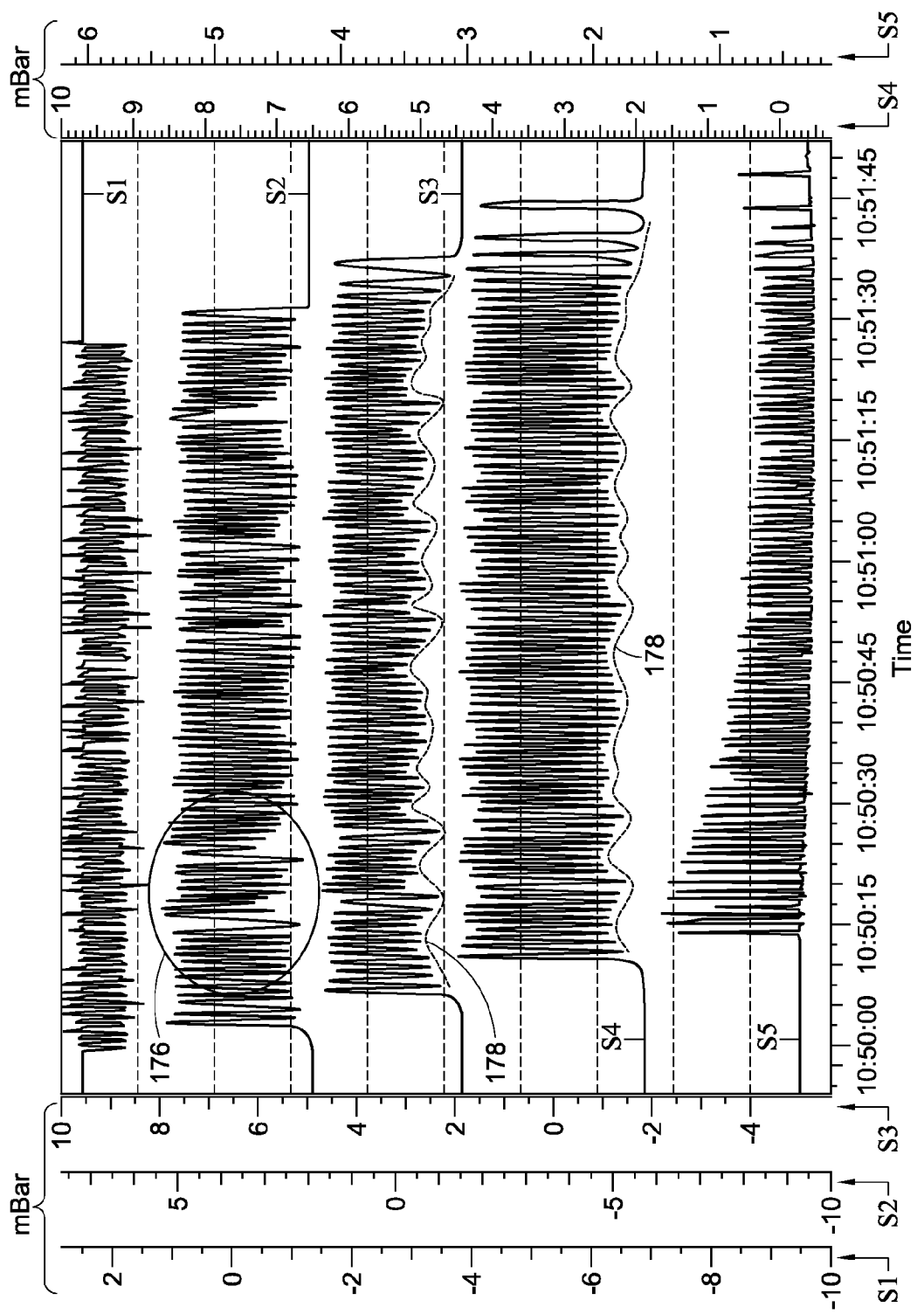

FIGS. 4-6 schematically show exemplary graphs that were generated during different tests with apparatus according to the present invention similar to that described above with reference to FIGS. 1-3. The apparatus 100 in question were fitted with five (FIG. 6) respectively six (FIGS. 4-5) pressure-type substrate detection sensors, in the graphs labelled S1, S2, . . . , S5, S6. Each of the sensors S was provided about midway between the lateral walls 108 of the process tunnel 102, along a line that defines an ideal path to be followed by the geometrical centers of substrates 140, such that the sensors S are exposed to maximal pressure variations upon passing of a substrate 140. The longitudinal spacing between the substrate detection sensors S was about one meter. Substrate detection sensor S1 was disposed at the entrance of the process tunnel 102; substrate detection sensor S5 (FIG. 6) respectively S6 (FIGS. 4-5) was disposed at an exit thereof, and the other substrate sensors S2, . . . , S4, S5 were consecutively disposed therebetween. The reference signals of the different sensors S1-S6 are shown on a common, horizontal time axis, while each reference signal is associated with a dedicated vertical axis that represents the pressure amplitude registered by the respective sensor S, measured relative to the pressure of an exterior/ambient atmosphere of the apparatus. The graphs of FIGS. 4-6 will be briefly discussed to illustrate some of the information an operator of the apparatus may derive therefrom.

Referring first to FIG. 4, which represents a run of fifteen substrates 140, as is easily inferred from the Figure by counting the number of pressure peaks in each reference signal. It is immediately apparent that the shapes of the pressure peaks in the reference signals of sensors S1 and S2 differ markedly from those in the reference signals of sensors S3-S6: each of them includes both a relatively wide negative (downward) pressure spike and a relatively narrow positive (upward) pressure spike, wherein the former precedes the latter. The double spike-form of the pressure peaks is a consequence of the fact that the entrance of the process tunnel 102 is constructed such that the tunnel space 104 is in open communication with the exterior environment of the tunnel. This allows substrates 140 to be inserted into the process tunnel 102 continuously, and in particular without the use of a relatively slow load lock. However, the tunnel space atmosphere is maintained at a pressure slightly above that of the exterior environment. To facilitate insertion of substrates into the tunnel, a gaseous exchange fluid is injected into the entrance passage, in the longitudinal transport direction T of the process tunnel 102. The insertion of a substrate 140 into the entrance interferes with this flow of exchange fluid since the substrate partially blocks the entrance/tunnel passage, which causes the pressure sensor S1 to register a pressure drop as the substrate passes it. The positive pressure spike is most likely a registration of the high pressure region that trails the substrate 140 due to stagnation of the exchange fluid against its trailing edge. The effect of the entrance construction is smaller but still noticeable at the location of the second substrate detection sensor S2, as is indicated by the negative pressure spike that precedes each of the positive pressure spikes in the reference signal of sensor S2. Depending on the substrate treatment to be carried out at the location of sensor S2, this noticeability may or may not be desirable and call for an adjustment of the flow rate at which exchange fluid is injected at the entrance. Another striking feature of the graph of FIG. 4 is that the pressure peaks in each of the reference signals are neatly and fairly regularly spaced apart. This means that the substrates 140 move in succession with approximately constant (longitudinal) gaps between them, and thus without the typically undesired formation of so-called traffic waves (cf. the discussion of FIG. 6 below). It may further be inferred from FIG. 4 that the substrates accelerate as they pass the first and second substrate detection sensor locations. The time-interval between corresponding pressure peaks (i.e. peaks relating to the passage of the same substrate) in the reference signals of the first and second substrate detection sensors S1, S2 is significantly smaller than that between corresponding pressure peaks in the reference signals of, for example, the fourth and fifth substrate detection sensors S4, S5. In fact, it can be seen at a glance that the bases of corresponding pressure peaks in the reference signals of substrate detection sensors S3-S6 approximately lie on a straight line 170, which, given the equidistant longitudinal spacing of the sensors, implies that the substrates 140 maintain an approximately constant speed as off the longitudinal coordinate of sensor S3.

Referring now to FIG. 5, which is a schematic representation of a snapshot of the display 162 of the monitoring and control unit 160 during a test run, showing a real-time updated running graph. It is immediately apparent that the reference signals of the substrate detection sensors S5 and S6 exhibit an anomaly. The reference signal of substrate detection sensor S5 comprises an abnormally wide pressure peak 172, while the reference signal of substrate detection sensor S6 comprises an associated, abnormally wide time interval 172 between two consecutive peaks, and two subsequent closely-spaced peaks. The wide pressure peak 172 in the reference signal of sensor S5 was caused by a substrate 140 that decelerated in the process tunnel segment fitted with sensor S5, which led to a protracted high pressure reading by that sensor. The dimpled top of the pressure peak 172 indicates that a trailing substrate 140 caught up with the decelerating substrate 140 and gave the latter a push in the longitudinal direction. It can be inferred from the neatly spaced apart, narrow pressure peaks in the reference signal of sensor S6 that this resolved the problem and put the lingering substrate 140 back on track. Due to the delay it incurred, however, it now precedes its successor by a relatively small gap.

The graph of FIG. 6 comprises five reference signals that reflect a finished test run of ninety substrates. The graph was constructed based on the data record of the reference signals after the actual test run had finished. FIG. 6 illustrates behavior of aggregates of substrates. As can be seen, the distribution of the pressure peaks in each of the reference signals of the respective sensors S1-S5 is not entirely uniform over time. During some time intervals the pressure peaks appear to cluster, while during other time intervals they appear to spread apart at the same substrate detection sensor location. A clustering of pressure peaks reflects a clustering of substrates 140. Where substrates 140 cluster, the (longitudinal) gaps between them become smaller, which restricts the (lateral) flow of gases between them and locally raises the gas pressure in the gas bearings. These local pressure increases, in turn, provide for some corrective action in that they work to push the substrates apart. During this dynamic process of clustering and spreading, travelling disturbances, also known as traffic waves, may occur in the distribution of pressure peaks/substrates. In a graph like that shown in FIG. 6, disturbances are detectable by either directly looking at the pressure peak density, or by looking at the envelope of the reference signals. The reference signal of substrate detection sensor S2, for example, clearly shows variations in peak density in the time interval marked 176. Similarly, the lower edges 178 of the reference signal-envelopes of the reference signals of substrate detection sensors S3 and S4, i.e. the curves 178 following/connecting the bases of the pressure peaks of these respective signals, show pronounced oscillation. Although variations in peak density and base curve oscillations need in themselves not be indications of immediate problems, they may preferably be monitored to see if they remain within proper limits.

In addition to displaying the reference signals for visual and typically qualitative inspection by an operator, the monitoring and control unit 160 of the apparatus 100 according to the present invention may be configured to automatically analyze the reference signals to detect irregularities or anomalies, and to alert the operator and/or take corrective action when the such an irregularity is detected.

An automated analysis may in particular include determining a longitudinal and/or lateral position-related property of at least one substrate 140 that moves through the process tunnel 102. By way of example, a number of such properties will be elaborated upon below.

One longitudinal position-related property of a single substrate 140 is its longitudinal position, and more particularly its longitudinal position as a function of time. Since the process tunnel 102 may typically define a linear track along which substrates 140 move in succession in the order in which they were inserted, it is possible to monitor the position of a single substrate 140 as it progresses. Or phrased otherwise, it is possible to associate each of the peaks in different reference signals with a single, individual substrate 140, thus tracking the substrate 140 as it moves through the process tunnel 102. In a relatively simple embodiment of the invention, substrate tracking may be performed using a plurality of longitudinally spaced apart substrate detection sensors S', and by counting the peaks in each of the reference signals generated by the respective substrate detection sensors S'. The first peak in each of the reference signals will correspond to a first substrate, the second peak in each of the signals will correspond to a second substrate, etc. The reliability of this tracking method may be improved by periodically briefly pausing (or otherwise varying the rate of) insertion of substrates 140 at the entrance of the process tunnel 102, so as to create a relatively large gap (or other spacing variation) in the substrate stream that may be detected and used to calibrate the wafer tracking process, for example by starting a new count.

Another longitudinal position-related property of a single substrate 140 is its (average) longitudinal velocity, which may be defined as the (average) rate of change of the longitudinal position of the substrate. The longitudinal velocity of a substrate 140 can be determined from substrate detection sensor reference signals in a variety of ways.

In some approaches, the velocity may be derived from a reference signal of a single substrate detection sensor S'. For instance, according to a first approach, which is better suited for use with pressure-type than optical-type substrate detection sensors, the slope of the leading and/or trailing flank of a pressure peak that marks the passage of a substrate 140 may be interpreted as a measure of the longitudinal velocity of the substrate: the steeper the slope, the higher substrate's velocity. This approach may require calibration to quantitatively determine what slope corresponds to what velocity, and to what accuracy. According to an alternative approach, which is particularly suitable for use with optical-type substrate detection sensors, the (average) width of the pressure peak rather than the slope of its flanks may be used. A well-defined square pulse in the reference signal of an optical substrate detection sensor may for example measure $\Delta t$ seconds, while it is known that the substrates 140 being processed have a characteristic longitudinal length L at the lateral coordinate of the substrate detection sensor (e.g. the diameter of a circular substrate, or the edge length of a square substrate). The longitudinal velocity of a substrate may then be calculated by dividing the substrate's characteristic longitudinal length L by the time-width of the pulse $\Delta t$, such that $v = L/\Delta t$.

In some other approaches, the longitudinal velocity of a substrate may be derived from multiple reference signals of different longitudinally spaced apart substrate detection sensors S'. Such an approach relies on the ability to associate a peak in a reference signal with the passage of a certain substrate (see the discussion of wafer tracking above). If two peaks in different reference signals can be associated with the same substrate, the longitudinal velocity of the substrate may be calculated by dividing the fixed and known longitudinal distance between the respective sensors by the time-interval between the (top of the) two peaks.

A further longitudinal position-related property of a substrate 140 it its (longitudinal) distance to its predecessor (i.e. the substrate in front of it) or successor (i.e. the substrate following it). This property may, of course, also be described as a longitudinal position-related property common to two substrates 140, namely as the distance between them. When optical-type substrate detection sensors generating clean, square pulsed reference signals are employed, the distance d between successive substrates may easily be calculated by determining the time interval $\Delta t_{tf\_lf}$ between the trailing flank of a first (earlier) pulse, and the leading flank of a second (later) pulse, and multiplying this time interval by the (average) velocity v of the two substrates, which may be determined as described above, to obtain $d=v \cdot \Delta t_{tf\_lf}$. When the apparatus 100 is fitted with pressure-type substrate detection sensors S', the distance d may analogously be calculated by determining a time interval $\Delta t_{tt}$ between the tops of two consecutive pressure peaks, multiplying this time interval by the (average) velocity v of the two substrates 140, and subtracting therefrom a characteristic longitudinal length L of the substrates, so as to obtain: $d=v \cdot \Delta t_{tt} - L$.

Examples of lateral position-related properties include two kinds of positional aberrations that may be picked up by a substrate 140 travelling through the process tunnel 102: translational and rotational aberrations. Lateral-translational aberration concerns the undesired sideways displacement of an entire substrate 140 towards one of the lateral walls 108 of the process tunnel 102, and away from the other. Rotational aberration or yaw concerns the undesired rotation of a substrate 140 around and axis perpendicular to the plane of the substrate, which may cause (longitudinally extending) lateral edges of a non-circular substrate, such as the square substrate 140 shown in FIG. 3, to turn out of alignment with the side walls 108.

A problem with these aberrations is that they may lead to contact between a moving substrate 140 and a static side wall 108. Due to the impact of a collision, a substrate 140 may fracture. The fracture may result in debris that may come into contact with subsequent substrates and is likely to cause a pile-up of substrates and congestion of the process tunnel. A rectangular substrate 140 has the additional problem, resulting from its lack of circular symmetry, that rotation may change its effective width. Consequently, a rotationally destabilized rectangular substrate may get stuck or jammed in between the two side walls 108 of the process tunnel 102. Again, a pile-up of substrates crashing into each other may be the result. In either case, the apparatus 100 would have to be shut down for maintenance to allow the process tunnel 102 to be cleared out. It is therefore important to monitor both the translational and rotational stability of substrates moving through the process tunnel, and to spot the onset of developing destabilizing behavior before its leads to actual substrate-wall collisions.

The lateral position and/or orientation of a substrate 140 may be derived by correlating and analyzing multiple reference signals of different, laterally or longitudinally spaced apart substrate detection sensors, which may be provided at a common longitudinal or lateral coordinate, respectively.

In one embodiment, for example, two pressure-type substrate detection sensors S' may be positioned at a common longitudinal coordinate, adjacent opposite lateral side walls 108 of the process tunnel 102, so as to be able to detect the presence of a substrate 140 in what should ideally be substrate-free longitudinal gas channels 106 (see FIG. 2). When a substrate 140 passes the longitudinal coordinate of the two substrate detection sensors, both sensors will generate a pressure peak. The amplitude of the pressure peak is a measure for the lateral width of the gas channel 106 at the respective sensor location.—Where a substrate 140 invades the longitudinal gas channel 106, either due to a translational or rotational aberration, the width of longitudinal gas channel 106 is locally diminished, which (again locally) obstructs the exhaust of gases from the tunnel space 104 to the gas conduits 112. Accordingly, the gas pressure in and around a section of the longitudinal gas channel 106 that is being pinched off rises. Similarly, where a substrate 140 laterally moves away from a side wall 108, the width of the respective longitudinal gas channel 106 increases. This locally facilitates the exhaust of gases from the tunnel space 104 and leads to a drop in gas pressure.—A difference in the amplitude between two substantially concurrent peaks registered by the two laterally spaced apart substrate detection sensors S' may therefore be interpreted as a measure of lateral position or lateral-translational aberration. At least in the case of a square substrate, a slight time interval or time shift between the tops of the two peaks may additionally indicate a rotational aberration. The detection of rotational aberration, however, will typically be easier and more accurate when optical-type sensors instead of pressure-type sensors are used.

Figure 7:
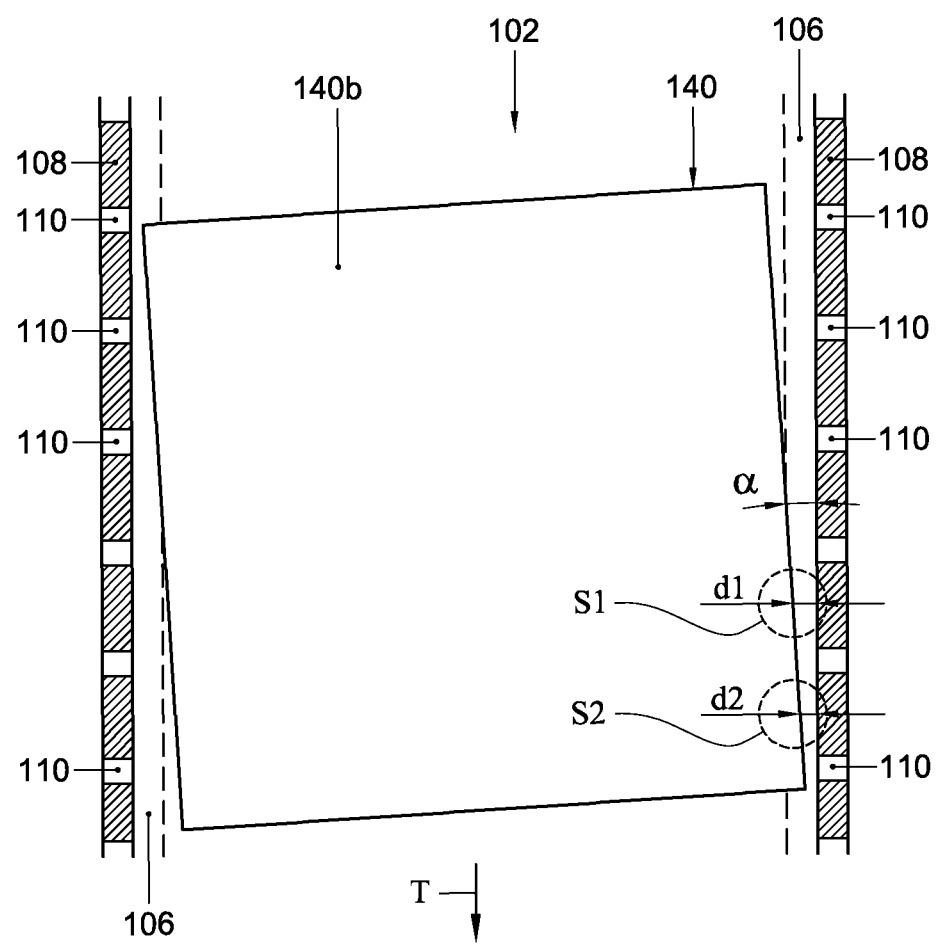

An example of an embodiment suitable for determining the rotational aberration and position of a substrate using optical-type substrate detection sensors is schematically shown in FIG. 7. The Figure is a diagrammatic cross-sectional plan view of a section of a process tunnel 102 similar to that shown in FIGS. 1-3, which section includes two optical-type substrate detection sensors S1, S2 that are longitudinally spaced apart at a common lateral coordinate. In FIG. 7 the locations of the sensors S1, S2 are indicated by interrupted circles.

Conceptually, the arrangement of each of the substrate detection sensors S1, S2 may resemble that of sensor $S'_3$ in FIG. 1. That is, each sensor S1, S2 may include a light source and a photo detector. The light source may include a light emitting surface, and the photo detector may include a light collecting surface, which surfaces may be disposed opposite to each other in/on the lower and upper tunnel wall 120, 130, respectively. In a practical embodiment, the light sources and the photo detectors may include optical fibers to allow them to work at a distance from the actual electronics and to thus facilitate the construction of the process tunnel. Each optical sensor S1, S2 may, for example, include two optic fibers. One fiber may, at a first end, be operably coupled to an actual light source, while its second end may provide for the light emitting surface. The other fiber may, at a first end, be operably coupled to an actual photo detector, while its second end may provide for the light collecting surface. The second ends of the two optic fibers of each sensor S1, S2 may be disposed in the lower and upper tunnel walls 120, 130, respectively, such that the light emitting surface and the light collecting surface of each sensor S1, S2 are aligned and face each other. It is understood that the light emitting and collecting surfaces effectively serve as the light source and the photo detector, respectively, at least insofar as the discussion here is concerned, and they will therefore also be referred to as such below where the context allows it.

The light source and photo detector of the sensors S1, S2 may be disposed adjacent a side wall 108 of the process tunnel 102, and extend laterally across the respective ideally substrate-free longitudinal gas channel 106 alongside it. As mentioned above, the lateral walls 108 of the process tunnel 108 may typically be spaced apart by a distance somewhat larger than a width of a substrate 140 to be processed, e.g. its width plus 0.5-3 mm. This implies that a gas channel 106 may typically have a width of about 0.25-1.5 mm. To ensure that substrate detection sensors S1, S2 adjacent to only one of the lateral walls 108 of the process tunnel 102 will always detect the passage of a substrate 140, their light sources and/or photo detectors may preferably span a width that is at least twice that of an ideal, uninvaded gas channel 106; hence, typically, about 0.5-3 mm.

The longitudinal spacing between the two sensors S1, S2 may be less than the edge length or longitudinal dimension of a substrate 140. This warrants that a substrate 140 may simultaneously interfere with both sensors S1, S2 at it passes by. In case it is desired to continuously monitor the rotational aberration and position of substrates 140 as they move through a longitudinal portion of the process tunnel 102, a plurality of sensors S1, S2 may be distributed along said portion of the tunnel 102, so that each two neighboring sensors are longitudinally spaced apart by a distance equal to or less than than half the edge length or longitudinal dimension of the substrates 140. This ensures that a single substrate 140 present in said portion of the process tunnel 102 will simultaneously interfere with two neighboring sensors at all times, allowing their reference signals to be combined to provide for rotational and positional information. Thus, in the case of square substrates 140 with an edge length of 150 mm, a process tunnel portion configured to monitor substrates 140 over its entire length may include a plurality of sensors which are longitudinally apart by no more than 75 mm.

In the schematically depicted embodiment of FIG. 7 the light sources and photo detectors of sensors S1, S2 include optical fibers as described above; hence their circular cross-section. To promote an accurate and reliable calibration of the sensors S1, S2 (see below)—in particular to avoid significant effects of the circumferential curvature of the light emitting and collecting surfaces on the calibration results—the diameter of optic fibers may be chosen about 20-30% larger than twice the width of a non-invaded gas channel 106, while the second ends of the fibers may be disposed partially within the respective lateral wall 108.

Figure 8:
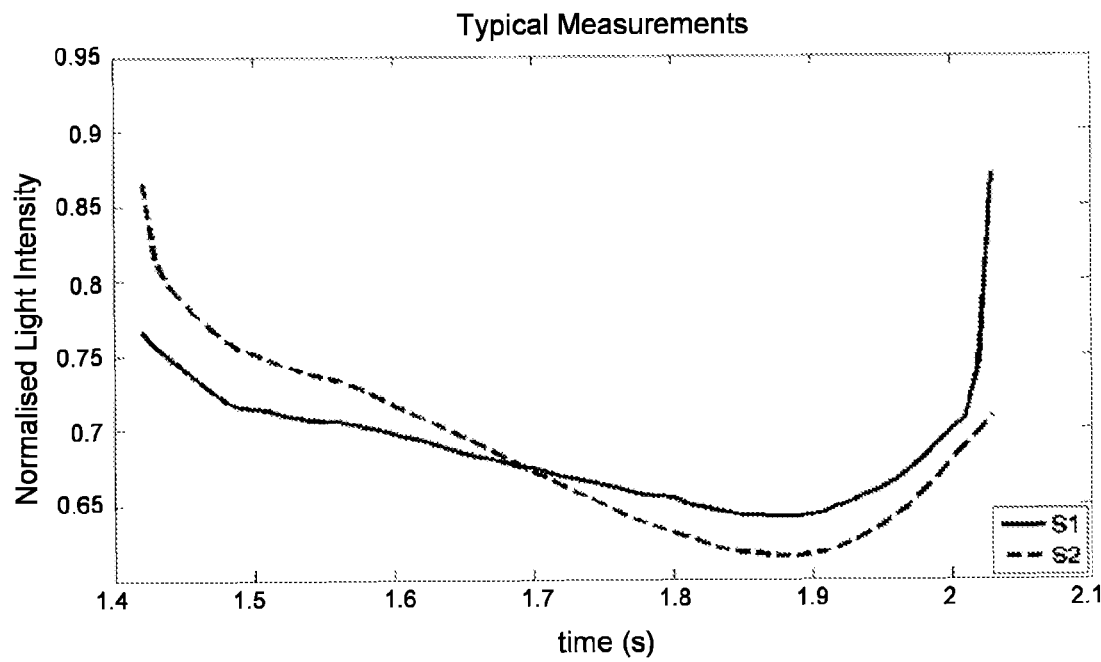
FIGS. 8-10 respectively illustrate, for the scene depicted in FIG. 7, typical normalized light intensity readings from the two optical sensors as the substrate passes by, lateral-separation-distance vs. normalized-light-intensity calibration curves for the two optical sensors, and lateral-separation-distance vs. time curves indicating the distance between an edge of the substrate and a lateral wall of the process tunnel at the locations of the two optical sensors.

When, during use, a substrate 140 crosses the tunnel section including the two optical sensors S1, S2, it blocks the transmission of light between the light emitting surface and the light collecting surface of the respective sensors. The amount of light that is blocked by the substrate 140 depends on its local proximity to the lateral tunnel wall 108 adjacent to which the sensors S1, S2 are disposed: the closer the substrate 140 is to the respective lateral wall 108, the more light it will block. During the passage of the substrate 140, the photodetector of each sensor S1, S2 generates a reference signal. FIG. 8 schematically illustrates typical normalized light intensity readings from the photodetectors of the two optical sensors S1, S2 as a function of time. In the figure, a normalized light intensity value of 1 for sensors S1, S2 is obtained when a longitudinally extending edge of the substrate 140 flatly abuts the lateral tunnel wall 108 opposite to that adjacent to which the sensors S1, S2 are provided. (In this position, the substrate 140 still blocks part of the light transmission between the two sensors S1, S2, such that normalized light intensity values greater than one can be obtained in case no substrate is present between the tunnel walls 120, 130 at the longitudinal position of the respective sensor.) A normalized light intensity value of 0 for either sensor S1, S2, on the other hand, means that the light transmission between the light emitting surface and light collecting surface of the respective sensor is fully blocked, which in the configuration of FIG. 7 is practically impossible due to the fact that the second ends of the optic fibers of the sensors S1, S2 are partially recessed in the associated lateral wall 108.

Figure 9:
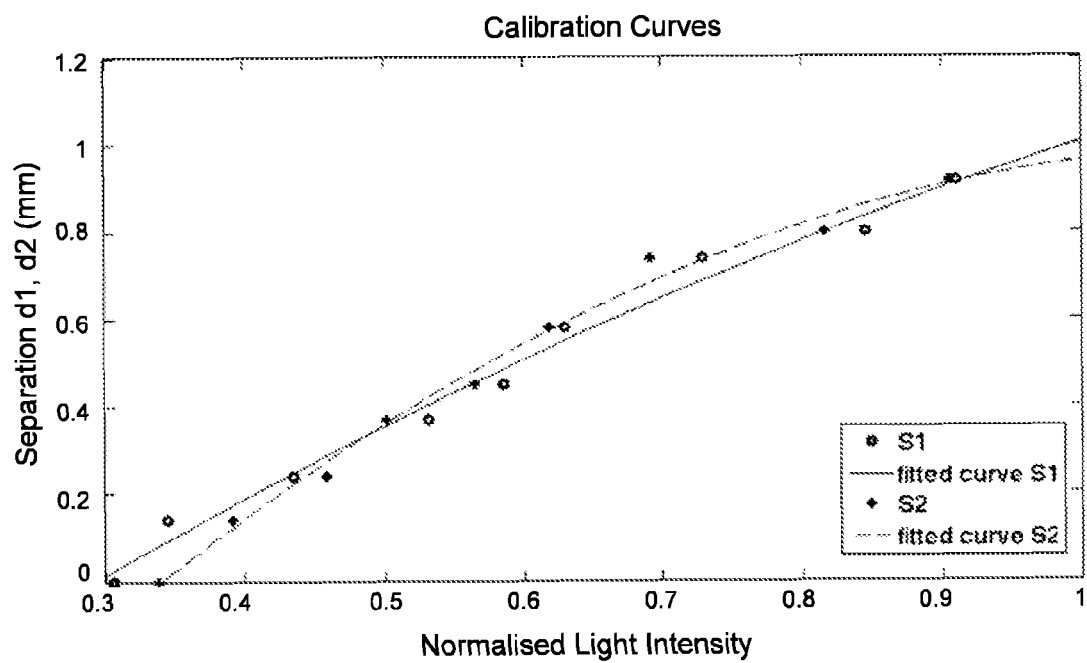

As can be inferred from the readings in FIG. 8, the passing substrate 140 is first registered by upstream sensor S1, and moments later by downstream sensor S2. Once and as long as both sensors S1, S2 register the presence of the substrate 140, information regarding orientation may be extracted from the normalized light intensity readings. These readings may vary as the substrate passes by. For instance, in the time interval 1.5-1.9 seconds the registered light intensities drop, indicating that the substrate laterally approaches the wall 108 at both sensor locations. From about 1.9 seconds, the light intensities registered by the sensors S1, S2 increases again, indicating that the substrate moves in a lateral direction away from the wall 108 at both sensor locations. To quantify these observations, the sensors S1, S2 need to be calibrated. FIG. 9 shows the calibration curves for both sensors S1, S2, which curves relate the respective separation distance d1, d2 between the substrate's edge and the wall 108 to the normalized light intensity registered by the respective sensor S1, S2. With the aid of the calibration curves in FIG. 9, the raw measurement data in FIG. 8 can be translated into the separation distance d1, d2 vs. time curves shown in FIG. 10. The separation distance vs. time curves in FIG. 10, together with knowledge about the configuration of the measurement setup schematically shown in FIG. 7 (in particular the longitudinal spacing between the sensors S1, S2), is sufficient to enable a virtually realtime reconstruction of the position and orientation of the wafer 140 inside the process tunnel 102 nearby the location of the sensors S1, S2.

Figure 10:
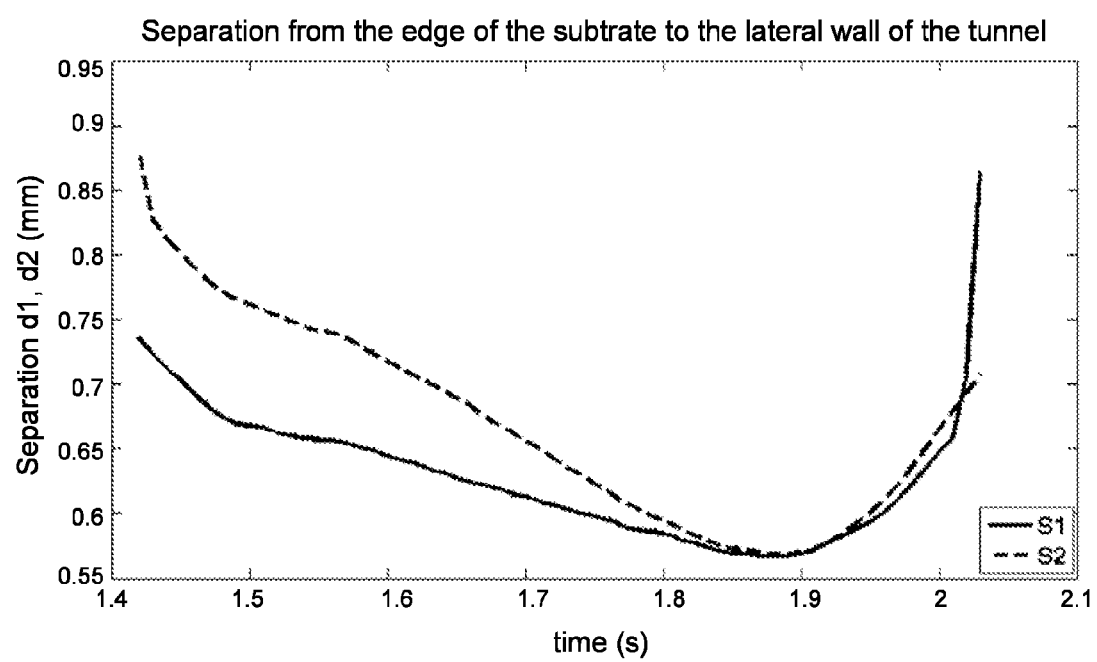
Figure 11:
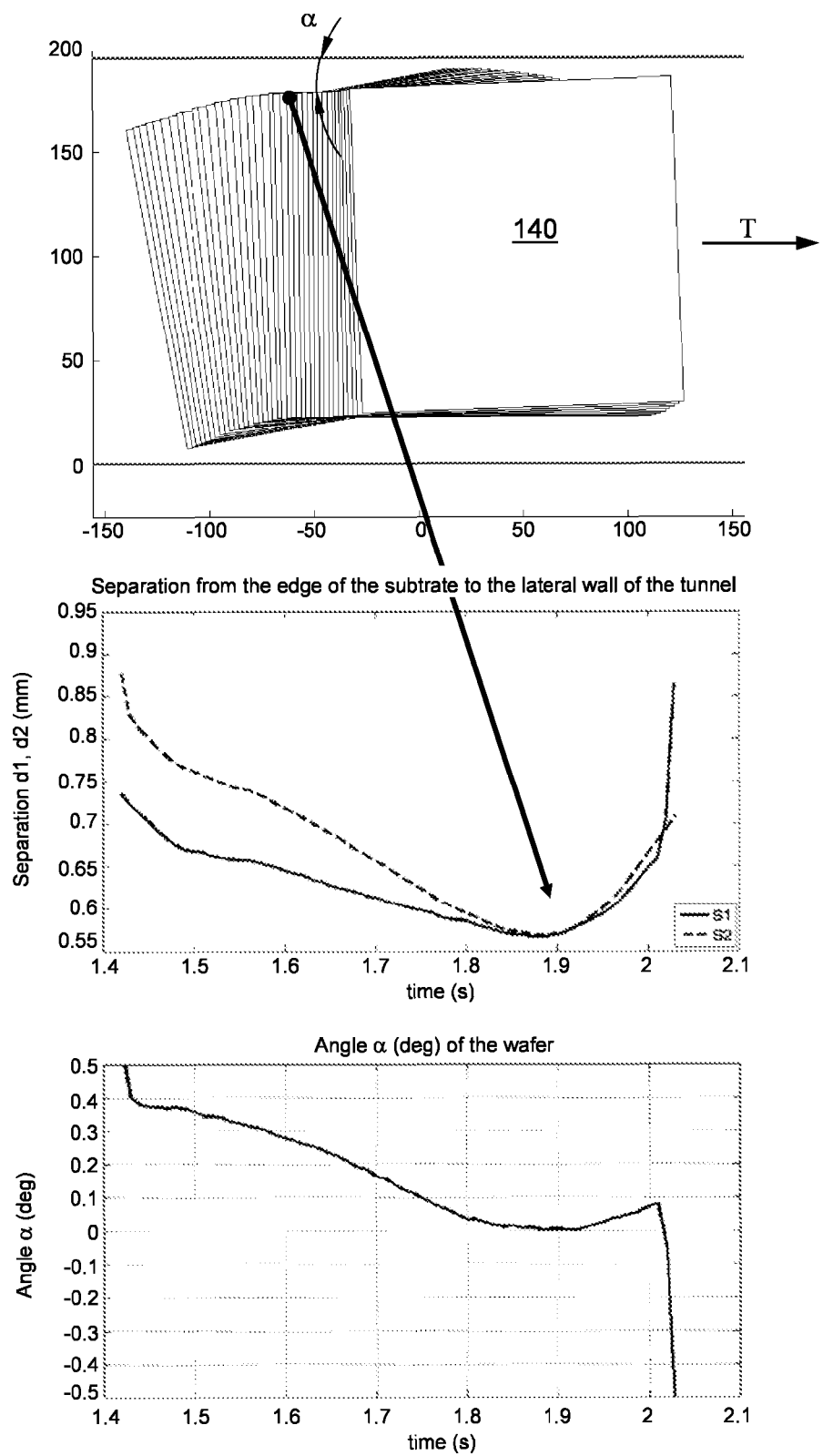
FIG. 11 is a reconstructed visual account of the motion of the substrate based on the data in FIG. 10 (top graph), a copy of FIG. 10 for direct comparison (middle graph), and a graph of the yaw angle alpha included between the edge of the substrate and the lateral wall of the process tunnel during passage of the substrate, also based on the data in FIG. 10 (bottom graph).

FIG. 11 shows a reconstructed visual account of the motion of the substrate based on the data in FIG. 10 (top graph). It additionally shows a copy of FIG. 10 for direct comparison (middle graph), and a graph of the yaw angle $\alpha$ included between the edge of the substrate 140 and the lateral wall 108 of the process tunnel 102 during passage of the substrate 140 (bottom graph). It is understood that the angle $\alpha$ in FIG. 11 (bottom graph) may, for each moment in time, be determined from the data in FIG. 10 in combination with the relation $\tan(\alpha)=(d1-d2)/l$, wherein l is the longitudinal spacing between the two sensors S1, S2. In addition, it should be recognized that the data at the very beginning and the very end of the curves in FIGS. 10 and 11 may not be fully reliable. This is due to the fact that the substrate 140, as it moves into between/from in between the respective sensors S1, S2, partially obstructs the transmission of light between the light emitting surfaces and light collecting surfaces thereof, while the recorded normalized light intensity readings do not yet/no longer represent pure separation distance information. The steep slopes at the beginning and the end of the angle $\alpha$ vs. time curve in FIG. 11 do therefore not represent actual angles. The steep downward slope at the beginning represents the substrate 140 entering between the light emitting surface and light collecting surface of sensor S2, while the steep downward slope at the end represents the substrate 140 leaving from between the light emitting surface and light collecting surface of sensor S1. A correct interpretation of the data in FIG. 11 gives the orientation of the substrate 140 at certain points in time within the depicted time interval. The approximate longitudinal position of the substrate 140 may be inferred from the periods during which the sensors S1, S2 register the presence of the substrate, and the dimensions of the substrate. For example, in case the sensors S1, S2 register the presence of the substrate 140 during an average time interval of $\Delta t$ seconds, and the edge length of the square substrate 140 is L, then the longitudinal position x(t) of the front edge of the substrate 140 may be approximated by $x(t) = x_{S1} + (L/\Delta t) \cdot t$, wherein $x_{S1}$ is the longitudinal position of sensor S1, $(L/\Delta t)$ is the average velocity of the substrate 140, and t is the time that has lapsed since the substrate was registered by sensor S1. Obviously, the calculation of the substrate's longitudinal position may be refined by taking into account, for example, the spatial dimensions of the sensors S1, S2, but since these will generally be significantly smaller than the dimensions of the substrate 140, the above exposition may be sufficiently accurate for many practical purposes.

An example of a longitudinal and lateral position-related property of a generally flat substrate 140 is its circumferential shape (as seen in a top or bottom view). The circumferential shape of a substrate 140 may roughly be reflected by the shape of a pressure peak in a reference signal of a pressure-type substrate detection sensor S'. A more accurate picture of the circumferential shape of a substrate 140 may be obtained by means of an array of preferably optical-type substrate detection sensors S'. The array may comprise both longitudinally and laterally spaced apart sensors in such a configuration that various edges of a passing substrate 140 may be detected within a certain relatively small time interval, e.g. a time interval of less than about 1 second. Based on the edge detections, the approximate shape of the substrate may be determined.

All of the above longitudinal and/or lateral position-related properties may be quantified, recorded and presented to an operator on a display for inspection. However, an operator may not always be closely watching the display of the monitoring and control unit 160 or even be present near the unit to detect problematic developments as they occur. Accordingly, the monitoring and control unit 160 may be configured to periodically or continuously determine for at least one longitudinal and/or lateral position related property of one or more substrates 140 whether it is inside a certain predetermined, property-specific tolerance range. For example, if the apparatus 100 is set up to determine the lateral position of (a geometric center of) a substrate 140 at a certain substrate detection sensor location, the monitoring and control unit 160 may be configured to determine whether the geometric center is within a certain distance from a longitudinal centerline of the process tunnel 102 (extending midway between the lateral walls 108). In another example, the apparatus 100 may be set up to determine the approximate circumferential shape of a substrate 140. In such a case, the monitoring and control unit may be configured to determine whether the shape of the substrate corresponds sufficiently to the shape of a non-deformed and undamaged substrate, and thus whether the substrate is subject to undesired stresses and/or has been damaged, e.g. by fracture.

The monitoring and control unit 160 may additionally be configured to alert an operator when the at least one position-related property strays from, i.e. no longer falls within the bounds of, the tolerance range, for example by displaying an eye-catching warning message on the display, generating a sound signal by means of an internal sound generation device, or sending an electronic message to an operators communication terminal, such as a cell phone.

Alternatively or in addition, the monitoring and control unit 160 may be configured to initiate a corrective action. In case the longitudinal and/or lateral position-related property in question allows for actual correction, the corrective action may include adapting operating parameters of the apparatus 100 so as to bring the property back inside the tolerance range. For example, in case the monitored property is the longitudinal velocity of a certain substrate 140, and it is observed that this substrate's velocity exceeds a certain predetermined maximum threshold, the monitoring and control unit 160 may control the gas sources linked to the gas injection channels 122, 132 to adapt a longitudinal pressure gradient in the gas bearings 124, 134 around the substrate 140, so as to slow it down and bring its velocity back below the maximum threshold. Alternatively, when it is observed that the substrate's velocity has dropped to zero, meaning that it got stuck, the monitoring and control unit 160 may, for instance, apply a negative pressure gradient to the gas bearings 124, 134 around the substrate 140 so as to force the substrate backwards in an attempt to loosen it, and/or control a substrate feed assembly at the entrance of the process tunnel 102 to change the rate at which it inserts new substrates, in particular to stop the insertion of new substrates. In case the longitudinal and/or lateral position-related property in question does not allow for actual correction, e.g. when substrate fracture is detected, the corrective action may include notifying the operator, and/or shutting down the operation of the apparatus 100 wholly or in part.

Although illustrative embodiments of the present invention have been described above, in part with reference to the accompanying drawings, it is to be understood that the invention is not limited to these embodiments. Variations to the disclosed embodiments can be understood and effected by those skilled in the art in practicing the claimed invention, from a study of the drawings, the disclosure, and the appended claims. Reference throughout this specification to "one embodiment" or "an embodiment" means that a particular feature, structure or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, it is noted that particular features, structures, or characteristics of one or more embodiments may be combined in any suitable manner to form new, not explicitly described embodiments.

The invention claimed is:

1. An apparatus, comprising:
    a process tunnel, extending in a longitudinal direction and bounded by at least a first and a second wall, said walls being mutually parallel and spaced apart so as to allow a substantially flat substrate, oriented parallel to the walls, to be accommodated there between, and
    a plurality of gas injection channels, provided in both the first and the second walls, wherein the gas injection channels in the first wall are configured to provide for a first gas bearing, while the gas injection channels in the second wall are configured to provide for a second gas bearing, said gas bearings being configured to floatingly support and accommodate said substrate there between,
    characterized in that
    the first and/or second walls of the process tunnel are fitted with at least one substrate detection sensor at a respective substrate detection sensor location, said substrate detection sensor being configured to generate a reference signal reflecting a presence of a substrate between said first and second walls near and/or at said substrate detection sensor location, wherein the at least one substrate detection sensor includes a pressure sensor configured to register a gas pressure of the first and/or second gas bearing; and in that the apparatus further comprises:

a monitoring and control unit that is operably connected to the at least one substrate detection sensor, and that is configured to record said reference signal as a function of time and to process said reference signal.

2. The apparatus according to claim 1, wherein the at least one substrate detection sensor further includes two substrate detection sensors whose respective substrate detection sensor locations are spaced apart along the longitudinal direction of the process tunnel.

3. The apparatus according to claim 1, wherein the process tunnel is further bounded by two lateral walls that interconnect the first and second walls, wherein each of said lateral walls defines a plurality of longitudinally spaced apart gas exhaust channels, and wherein the at least one substrate detection sensor further includes two optical sensors whose respective substrate detection sensor locations are adjacent a said lateral wall of the process tunnel, and spaced apart along the longitudinal direction thereof.

4. The apparatus according to claim 1, wherein the at least one substrate detection sensor further includes two substrate detection sensors whose respective substrate detection sensor locations are spaced apart along the lateral direction of the process tunnel.

5. The apparatus according to claim 1, wherein the monitoring and control unit includes a display on which it is configured to show information encoded in the reference signal of the at least one substrate detection sensor for inspection by an operator.

6. The apparatus according to claim 1, wherein the monitoring and control unit is configured to determine at least one longitudinal and/or lateral position-related property of at least one substrate.

7. The apparatus according to claim 6, wherein the monitoring and control unit is configured to use the reference signals of multiple substrate detection sensors in order to determine the at least one longitudinal and/or lateral position-related property.

8. The apparatus according to claim 6, wherein the at least one longitudinal and/or lateral position-related property to be determined by the control unit includes one of:
a longitudinal position of a substrate as a function of time;
a longitudinal velocity of a substrate; and
a longitudinal distance between a substrate and another substrate present in the process tunnel.

9. The apparatus according to claim 6, wherein the at least one longitudinal and/or lateral position-related property to be determined by the control unit includes one of:
a lateral-translational aberration of a substrate; and
a rotational aberration of the substrate.

10. The apparatus according to claim 6, wherein the at least one longitudinal and/or lateral position-related property to be determined by the monitoring and control unit includes: an approximate circumferential shape of a substantially flat substrate.

11. The apparatus according to claim 6, wherein the monitoring and control unit is configured to determine for said at least one longitudinal and/or lateral position-related property whether or not it is inside a predetermined, property-specific tolerance range.

12. The apparatus according to claim 11, wherein the monitoring and control unit is configured to initiate corrective action when it detects that said at least one longitudinal and/or lateral position-related property is not inside said predetermined, property-specific tolerance range, wherein said corrective action includes adapting operating parameters of the apparatus so as to bring said property back inside the tolerance range.

13. A method, comprising:
providing a process tunnel, extending in a longitudinal direction and bounded by at least a first and a second wall, said walls being mutually parallel and spaced apart so as to allow a substantially flat substrate, oriented parallel to the walls, to be accommodated there between;
providing a first gas bearing by providing flowing gas alongside the first wall, and providing a second gas bearing by providing flowing gas alongside the second wall;
successively introducing a plurality of substrates in between the first wall and the second wall, such that each substrate is floatingly accommodated between the first and second gas bearings, and
moving said substrates in succession along the longitudinal direction of the process tunnel;
characterized in that the method further comprises:
repeatedly registering whether a substrate is present between the first and second tunnel walls near and/or at least one substrate detection location in said process tunnel using at least one substrate detection sensor, thereby recording at least one reference signal reflecting a presence of a substrate between said first and second walls near and/or at said at least one substrate detection location as a function of time, wherein the at least one substrate detection sensor includes a pressure sensor configured to register a gas pressure of the first and/or second gas bearing; and
processing said at least one recorded reference signal.

14. The method according to claim 13, wherein the at least one recorded reference signal reflects the presence of multiple, different substrates of said plurality of substrates at said at least one substrate detection location at different times.

15. The method according to claim 13, wherein processing the at least one recorded reference signal includes displaying information encoded in said reference signal on a display for inspection by an operator.

16. The method according to claim 15, wherein the information being displayed includes an amplitude-versus-time graph of said reference signal from said substrate detection location, said graph being suitable for revealing interactions between the substrates of said plurality of substrates near and/or at the respective substrate detection location in said process tunnel.

17. The method according to claim 13, wherein processing the at least one recorded reference signal includes determining at least one longitudinal and/or lateral position-related property of at least one substrate of said plurality of substrates.

18. The method according to claim 17, wherein the determination of the at least one longitudinal and/or lateral position-related property involves a use of reference signals from multiple longitudinally and/or laterally spaced apart substrate detection locations.

19. The method according to claim 17, wherein the at least one longitudinal and/or lateral position-related property is a property of a single substrate and includes one of:
- a longitudinal position of a substrate as a function of time; and
- a longitudinal velocity of a substrate.

20. The method according to claim 19, wherein the at least one longitudinal and/or lateral position-related property is the longitudinal velocity of a substrate, and wherein the longitudinal velocity of the substrate is at least partially determined from a slope of a leading or a trailing flank of a peak in the reference signal that marks the passage of the substrate.

21. The method according to claim 17, wherein the at least one longitudinal and/or lateral position-related property is a property of a single substrate and includes one of:
- a lateral-translational aberration of a substrate; and
- a rotational aberration of the substrate (110).

22. The method according to claim 17, wherein the at least one longitudinal and/or lateral position-related property is a common property of multiple substrates, comprising at least one of:
- a longitudinal distance between two substrates;
- an average longitudinal distance between at least two substrates; and
- a variation in longitudinal distances between multiple successive substrates, possibly indicative of the occurrence of traffic waves.

23. The method according to claim 17, further comprising:
- determining for said at least one longitudinal and/or lateral position-related property whether or not it is inside a predetermined, property-specific tolerance range.

24. The method according to claim 23, further comprising:
- if it is detected that said at least one longitudinal and/or lateral position-related property of the respective substrate(s) is not inside said tolerance range, initiating a corrective action that includes adapting operating parameters of the process tunnel so as to bring said property back inside the tolerance range.

* * * * *